(12) United States Patent
Zhang

(10) Patent No.: US 11,798,649 B2
(45) Date of Patent: Oct. 24, 2023

(54) DEFECT REPAIR CIRCUIT AND DEFECT REPAIR METHOD

(71) Applicant: CHANGXIN MEMORY TECHNOLOGIES, INC., Anhui (CN)

(72) Inventor: Liang Zhang, Shanghai (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 133 days.

(21) Appl. No.: 17/467,529

(22) Filed: Sep. 7, 2021

(65) Prior Publication Data

US 2022/0084621 A1   Mar. 17, 2022

Related U.S. Application Data

(63) Continuation of application No. PCT/CN2021/100915, filed on Jun. 18, 2021.

(30) Foreign Application Priority Data

Sep. 11, 2020   (CN) .......................... 202010954074.4

(51) Int. Cl.
*G11C 29/00* (2006.01)
*G11C 29/44* (2006.01)
(Continued)

(52) U.S. Cl.
CPC .......... *G11C 29/4401* (2013.01); *G11C 29/10* (2013.01); *G11C 29/1201* (2013.01); *G11C 29/18* (2013.01)

(58) Field of Classification Search
CPC .................................................. G11C 29/4401
See application file for complete search history.

(56) References Cited

U.S. PATENT DOCUMENTS 7,486,577 B2 *  2/2009  Kim ..................... G11C 29/789
                                                         365/225.7
10,453,549 B2 * 10/2019  Lee ........................ G11C 29/76
(Continued)

FOREIGN PATENT DOCUMENTS

CN        101329918 A       12/2008
CN        107148650 A        9/2017
(Continued)

*Primary Examiner* — Min Huang
(74) *Attorney, Agent, or Firm* — Cooper Legal Group, LLC

(57) ABSTRACT

Disclosed are a defect repair circuit and a defect repair method. The defect repair circuit includes: a test module, configured to perform defect test on a memory cell array in a test module to determine a defective memory cell, and output test address information and defect flag signal corresponding to the memory cell; a defect information storage module, connected with the test module, configured to store defect address information responsive to the defect flag signal, the defect address information being the test address information of the defective memory cell, and further configured to output first address information responsive to an externally input repair selection signal, the first address information being one of multiple pieces of defect address information; and a repair module, connected with the defect information storage module and configured to repair a corresponding defective memory cell according to the received first address information.

12 Claims, 12 Drawing Sheets

(51) Int. Cl.
    *G11C 29/12*     (2006.01)
    *G11C 29/10*     (2006.01)
    *G11C 29/18*     (2006.01)

(56) References Cited

U.S. PATENT DOCUMENTS

| | | | |
|---|---|---|---|
| 2003/0107925 A1 | 6/2003 | Koss | |
| 2012/0127813 A1* | 5/2012 | Jeong | G11C 29/808 |
| | | | 365/200 |
| 2015/0187436 A1* | 7/2015 | Qu | G11C 29/72 |
| | | | 714/720 |
| 2019/0385661 A1* | 12/2019 | Koo | G11C 29/81 |
| 2021/0375379 A1* | 12/2021 | Lim | H01L 25/0652 |

FOREIGN PATENT DOCUMENTS

| | | |
|---|---|---|
| CN | 108182962 A | 6/2018 |
| CN | 109741782 A | 5/2019 |
| CN | 110400584 A | 11/2019 |
| CN | 210925503 U | 7/2020 |
| CN | 212303083 U | 1/2021 |

\* cited by examiner

DEFECT REPAIR CIRCUIT AND DEFECT REPAIR METHOD

CROSS-REFERENCE TO RELATED APPLICATIONS

This application is a continuation of International patent application No. PCT/CN2021/100915, filed on Jun. 18, 2021, which is filed based upon and claims priority to Chinese patent application No. 202010954074.4, filed on Sep. 11, 2020. The contents of International patent application No. PCT/CN2021/100915 and Chinese patent application No. 202010954074.4 are incorporated herein by reference in their entireties.

TECHNICAL FIELD

The disclosure relates to a defect repair circuit and a defect repair method.

BACKGROUND

A memory, as one of present important memory elements, is widely applied to the fields of computers, communications, home appliances, and the like, due to multiple memory functions and low manufacturing cost.

Data storage reliability is the key performance of the memory. Therefore, it is necessary to test the storage performance of a memory cell in the memory and repair a defective memory cell to ensure the storage performance of the memory.

SUMMARY

According to multiple embodiments, a first aspect of the disclosure provides a defect repair circuit, which includes a processor; and a memory configured to store instructions executable by the processor; the processor is configured to:

perform defect test on a memory cell array in a test mode to determine a defective memory cell, and output test address information and defect flag signal corresponding to the memory cell;

store defect address information responsive to the defect flag signal; the defect address information being the test address information of the defective memory cell, and output first address information responsive to an externally input repair selection signal, the first address information being one of multiple pieces of defect address information; and repair a corresponding defective memory cell according to the received first address information.

According to multiple embodiments, a second aspect of the disclosure provides a defect repair method, which includes as follows.

A test mode is entered.

A defect repair circuit performs defect test on a memory cell array to determine a defective memory cell, and outputs test address information and defect flag signal corresponding to the memory cell.

The defect repair circuit stores defect address information responsive to the defect flag signal, the defect address information being the test address information of the defective memory cell.

The test mode is quit, and a repair mode is entered.

The defect repair circuit outputs first address information responsive to an externally input repair selection signal, the first address information being one of multiple pieces of defect address information.

The defect repair circuit repairs a corresponding defective memory cell according to the received first address information.

The repair mode is quit.

Details of one or more embodiments of the disclosure will be proposed in the following drawings and descriptions. Other features and advantages of the disclosure will become clearer in the specification, the drawings, and the claims.

BRIEF DESCRIPTION OF THE DRAWINGS

In order to describe the technical solutions in embodiments of the disclosure or a conventional art more clearly, the drawings required to be used in descriptions about the embodiments or the conventional art will be simply introduced below. It is apparent that the drawings described below are only some embodiments of the disclosure. Other drawings may further be obtained by those of ordinary skill in the art according to these drawings without creative work.

Figure 1:
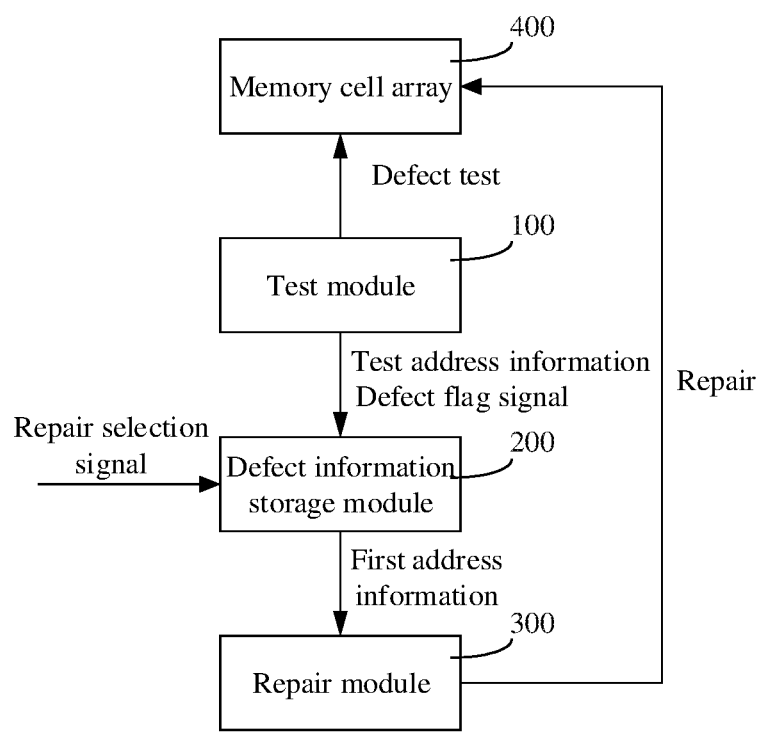
FIG. 1 is a structure diagram of a defect repair circuit according to a first embodiment.

Descriptions about the reference sign numbers of the components:

test module 100; defect information storage module 200; address storage unit 210; address buffer memory 211; flag bit storage unit 220; flag buffer memory 221; second selection circuit 230; third selection circuit 240; repair module 300; memory cell array 400; and first selection circuit 500.

DETAILED DESCRIPTION

At present, an external tester is needed to support test and repair of memory cells, which results in inconvenience and poor flexibility in repair.

For easily understanding embodiments of the disclosure, the embodiments of the disclosure will be described more comprehensively below with reference to the related drawings. The drawings illustrate preferred embodiments of the disclosure. However, the embodiments of the disclosure may be implemented in various forms and is not limited to the embodiments described herein. Instead, these embodiments are provided to make the contents disclosed in the embodiments of the disclosure understood more thoroughly and comprehensively.

Unless otherwise defined, all technical and scientific terms used in the disclosure have the same meanings as commonly understood by those skilled in the art of the embodiments of the disclosure. In the disclosure, terms used in the description of the embodiments of the disclosure are only for a purpose of describing specific embodiments and not intended to limit the embodiments of the disclosure. Term "and/or" used herein includes one or any and all combinations of multiple related items which are listed.

It can be understood that terms "first", "second", etc., used in the disclosure may be configured in the disclosure to describe various components but are not intended to limit these components. These terms are only used to distinguish a first element from another element. For example, without departing from the scope of the disclosure, the first address information may be called the second address information, and similarly, the second address information may be called the first address information. The first address information and the second address information are both address information but not the same address information.

It can be understood that "connect" in the following embodiments should be understood as "electrically connect", "communication connection", etc., if electrical signals or data is transmitted between connected circuits, modules, units, etc.

As used herein, singular forms "a/an", "one", and "the" may also include plural forms, unless otherwise specified in the context. It is also to be understood that terms "include/contain", "have", etc., specify the existence of a stated feature, whole, step, operation, component, part, or a combination thereof, but do not exclude the possibility of existence or addition of one or more other features, wholes, steps, operations, components, parts, or combinations thereof.

FIG. 1 is a structure diagram of a defect repair circuit according to a first embodiment. Referring to FIG. 1, the defect repair circuit in the embodiment includes a test module 100, a defect information storage module 200 and a repair module 300. The defect repair circuit in the embodiment of the disclosure is configured to test a memory cell in a memory to determine and repair a defective memory cell. The memory may be a dynamic random access memory (DRAM), a static random access memory (SRAM), etc. The memory includes multiple memory blocks, each memory block includes multiple memory cell arrays 400, each memory cell array 400 includes multiple memory cells that are arrayed in an array, and each memory cell may store data. Therefore, a storage function of the memory is realized by the multiple memory cells.

The test module 100 is configured to perform defect test on the memory cell array 400 in a test mode to determine a defective memory cell, and output test address information and defect flag signal corresponding to the memory cell.

The test module 100 is connected/coupled with the memory cell array 400 to test the connected memory cell array 400 in the test mode. That is, when the memory is in the test mode, the test module 100 executes a corresponding test function. The memory is switched to the test mode responsive to a test triggering signal. Exemplarily, every time when powered on, the memory may automatically generate a test triggering signal at first to be switched to the test mode. The memory may also be switched to the test mode responsive to a test triggering signal which is externally input, and the test triggering signal may be, for example, a signal input by a user through an electronic device connected with the memory. The memory may also be switched to the test mode responsive to a test triggering signal output by a built-in controller, and the controller may output a test triggering signal every time when the memory runs for preset time to regularly monitor the memory cell array 400.

A defect test manner may be that the test module 100 automatically generates one or more pieces of test data responsive to the test triggering signal, writes the test data to each memory cell to be tested respectively, reads data from the memory cell a certain time later, compares the read data and the automatically generated test data to determine whether the storage function of the memory cell is normal, and if data read from a memory cell is different from the written data, determines that the memory cell is a defective memory cell.

After the test module 100 tests the defective memory cell, a pulse signal (fail pulse) in the defect flag signal may be correspondingly generated. That is, if a presently tested memory cell is not a defective memory cell, no pulse signal needs to be generated, and a state of the defect flag signal is 0, so that unnecessary operations are reduced. If the presently tested memory cell is a defective memory cell, a pulse signal in the defect flag signal is synchronously generated. Every time when the test module 100 completes detecting a memory cell, test address information and defect flag signal corresponding to the tested memory cell are synchronously sent to the defect information storage module 200, thereby storing defect information.

The defect information storage module 200 is connected with the test module 100, is configured to store defect address information responsive to the defect flag signal, the defect address information being the test address information of the defective memory cell, and is further configured to output first address information responsive to an externally input repair selection signal, the first address information being one of multiple pieces of defect address information.

The defect information storage module 200 is configured with a clock end, and the clock end of the defect information storage module 200 is connected with the test module 100 such that the defect information storage module 200 stores the test address information responsive to the pulse signal in the defect flag signal. For example, the defect information storage module 200 may store the test address information response to a rising edge of the pulse signal. It can be understood that, if a tested memory cell is not a defective memory cell, a defect flag signal corresponding to the memory cell includes a continuous low level, namely no rising edge is included, and test address information of the memory cell is sent to the defect information storage module 200 but cannot be stored. If the memory cell is a defective memory cell, the test address information (i.e., defect address information) of the defective memory cell may be stored responsive to a rising edge of the pulse signal, thereby realizing a defect information storage function.

It is to be noted that the defect information may be, but not limited to, the abovementioned defect address information. However, the defect address information is required information for execution of a repair process, descriptions are made mainly around the defect address information in the embodiment. It can be understood that other defect information may be stored in a storage manner similar to that for the defect address information, and thus elaborations are omitted in the embodiment and another embodiment. Exemplarily, the other defect information may be defect level information determined according to a test result, and the test module 100 may send the defect level information to the defect information storage module 200 for storage, so that a memory cell of a relatively high defect level may be preferentially repaired during the repair, to improve the repair reliability.

The externally input repair selection signal is configured to instruct the defect information storage module 200 to output different first address information in a time sharing manner. It can be understood that, if multiple defective memory cells are determined through defect test, multiple pieces of defect address information may be output in the time sharing manner to cause the repair module 300 to accurately receive each piece of defect address information through a relatively small number of interfaces and perform corresponding repair. Furthermore, "external" in the externally input repair selection signal refers to the outer side of the defect repair circuit. For example, the repair selection signal may be output by the controller in the memory, namely no external tester or controller is needed in the embodiment, and automatic storage of the defect address information and automatic repair may be implemented based on an internal structure of the memory.

The repair module 300 is connected with the defect information storage module 200, and is configured to repair a corresponding defective memory cell according to the received first address information.

Repair refers to executing a data read/write function that the defective memory cell should execute using a redundant memory cell instead of the defective memory cell during data read/write, with the defective memory cell still arranged at an original address but not required to execute a read/write operation. Exemplarily, repair may include row repair and/or column repair. Row repair refers to replacing a row address corresponding to the defective memory cell with a row address of a redundant memory cell. Column repair refers to replacing a column address corresponding to the defective memory cell with a column address of the redundant memory cell.

Specifically, the repair module 300 stores redundant address information of multiple redundant memory cells inside. Therefore, after the first address information is acquired, a mapping relationship between the first address information and redundant address information may be established according to an internal preset rule, namely repair of the defective memory cell is implemented.

In the embodiment, the defect repair circuit includes the test module 100, the defect information storage module 200 and the repair module 300. The test module 100 is configured to perform defect test on the memory cell array 400 in the test module to determine the defective memory cell, and output the test address information and the defect flag signal corresponding to the memory cell. The defect information storage module 200 is connected with the test module 100, is configured to store the defect address information responsive to the defect flag signal, the defect address information being the test address information of the defective memory cell, and is further configured to output the first address information responsive to the externally input repair selection signal, the first address information being one of the multiple pieces of defect address information. The repair module 300 is connected with the defect information storage module 200, and is configured to repair the corresponding defective memory cell according to the received first address information. A repair operation may be performed through the built-in test module 100 and repair module 300 in the memory based on an own hardware structure. Moreover, the repair module 300 in the defect repair circuit of the embodiment may reuse a structure and function of a post package repair circuit, and an error address is automatically stored through the added test module 100, thereby implementing intelligent repair together. In the embodiment, few circuit structures are added to the defect repair circuit, so that compatibility with a chip with a relatively small area may be achieved. Moreover, no tester and controller need to store an address of the defective memory cell, so that convenience and reliability of the defect repair circuit are improved.

Figure 2:
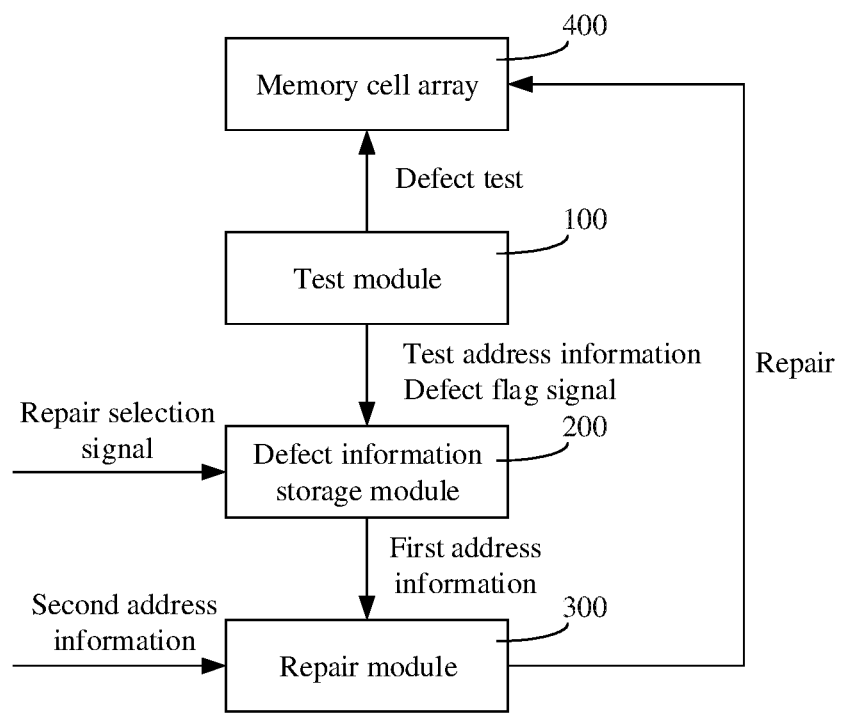
FIG. 2 is a structure diagram of a defect repair circuit according to a second embodiment.

FIG. 2 is a structure diagram of a defect repair circuit according to a second embodiment. As illustrated in FIG. 2, in the embodiment, the repair module 300 is further configured to receive externally input second address information, and repair the defective memory cell corresponding to the first address information or the second address information. Specifically, the first address information is automatically acquired by the test module 100 by using defect test, and the second address information may be acquired and stored by a memory supplier by using package test after packaging is completed, namely the first address information may be set in the memory before delivery of the memory. The first address information may usually be a device hardware defect caused by a preparation process. In the embodiment, the first address information may further include the defect address information corresponding to the defective memory cell produced in a using process of the user. Therefore, the repair module 300 in the embodiment may implement repair for both the first address information and the second address information, so that a more flexible defect repair circuit is implemented.

Figure 3:
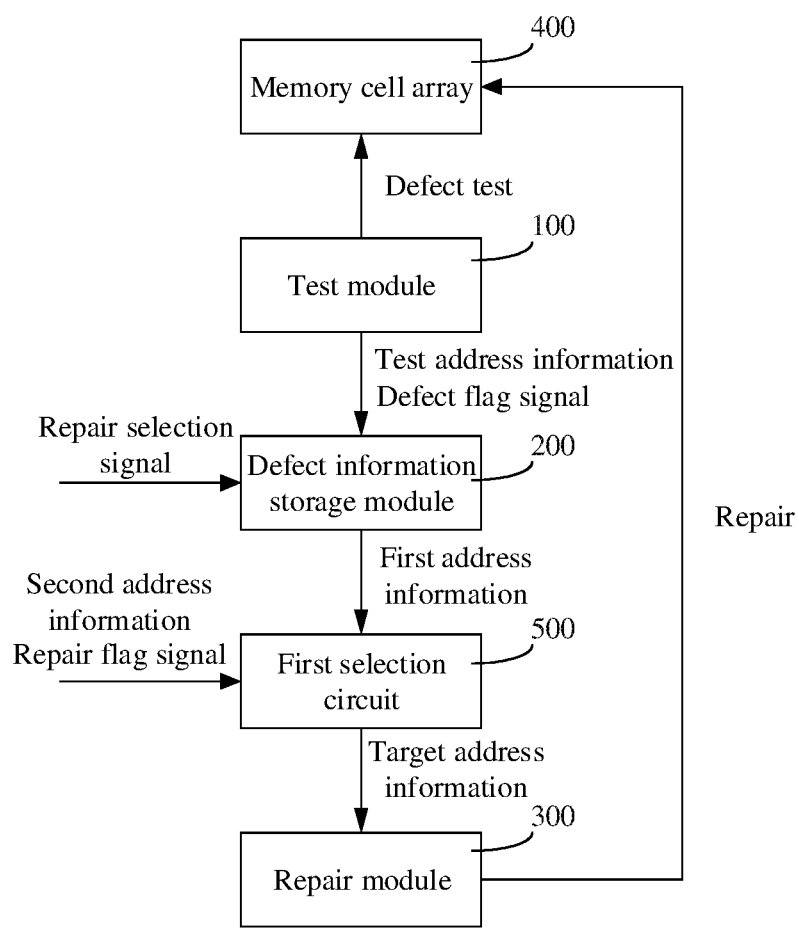
FIG. 3 is a structure diagram of a defect repair circuit according to a third embodiment.

FIG. 3 is a structure diagram of a defect repair circuit according to a third embodiment. Referring to FIG. 3, the defect repair circuit in the embodiment includes a test module 100, a defect information storage module 200, a repair module 300 and a first selection circuit 500. Implementation modes of the test module 100, the defect information storage module 200 and the repair module 300 are similar to the implementation modes in the embodiment illustrated in FIG. 1, and will not be repeated herein.

The first selection circuit 500 is connected with the defect information storage module 200 and the repair module 300 respectively, and is configured to receive first address information, second address information and repair selection signal, and generate target address information responsive to the repair selection signal. The target address information is one of the first address information and the second address information.

Specifically, the first selection circuit 500 may be a multiplexer, for example, a 2-to-1 multiplexer. The first selection circuit 500 is configured with two transmission paths. A first transmission path is configured to connect the defect information storage module 200 and the repair module 300 to transmit the first address information to the repair module 300. The second transmission path is configured to receive the second address information to transmit the second address information to the repair module 300. The first selection circuit 500 is further configured with a control end, and the control end is configured to input a repair flag signal, thereby selecting one of the two transmission paths to be switched on. Exemplarily, the first transmission path may be switched when the repair flag signal is 1, so that, if the defective memory cell corresponding to the first address information needs to be repaired, the controller of the memory outputs the repair flag signal of which a state is 1 to send the first address information as the target address information to the repair module 300 to implement repair.

Figure 4:
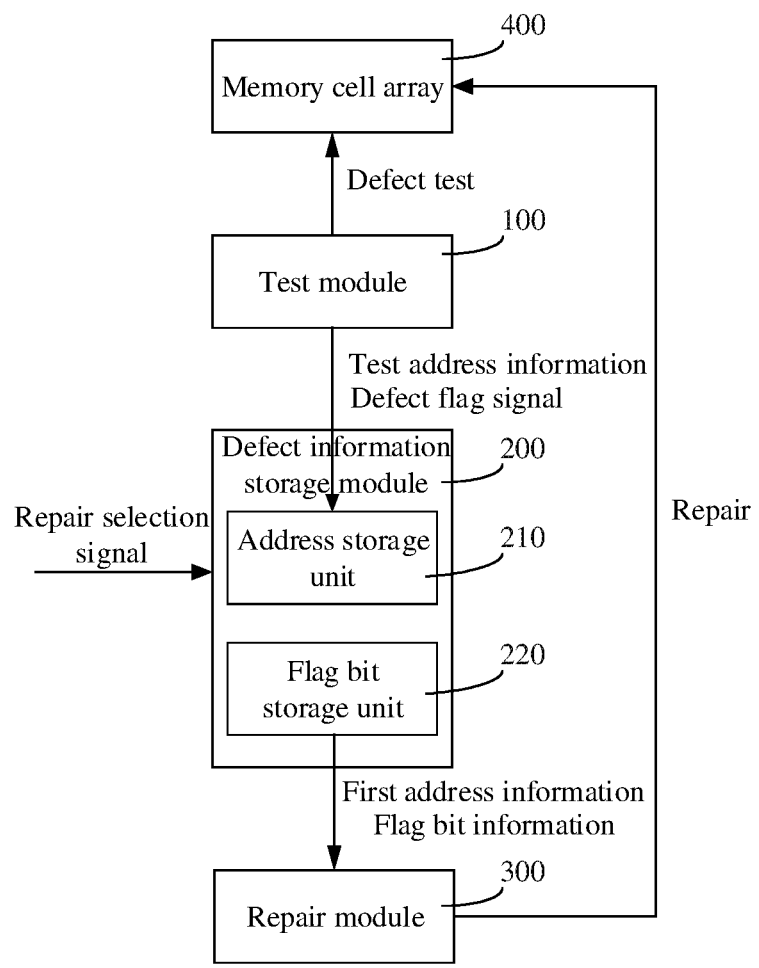
FIG. 4 is a structure diagram of a defect repair circuit according to a fourth embodiment.

FIG. 4 is a structure diagram of a defect repair circuit according to a fourth embodiment. Referring to FIG. 4, in the embodiment, the defect information storage module 200 includes a flag bit storage unit 220.

Specifically, the flag bit storage unit 220 is connected with the test module 100 and the repair module 300 respectively, and is configured to generate and store corresponding flag bit information for the defective memory cell responsive to the defect flag signal. Each memory cell is configured with a piece of flag bit information (fail flag), and the flag bit information is configured to indicate whether the corresponding memory cell is a defective memory cell. Exemplarily, the flag bit information of the defective memory cell is set to 1, and the flag bit information of another memory cell is set to 0. When another operation is performed, whether the corresponding memory cell is a defective memory cell may be determined according to the flag bit information, so that the repair operation and the like may be performed more efficiently. Furthermore, referring back to FIG. 4, the defect information storage module 200 further includes an address storage unit 210. The address storage unit 210 is connected with the test module 100 and the repair module 300 respectively to store the defect address information of the defective memory cell such that the first address information is selected from the multiple pieces of defect address information and output to the repair module 300.

Figure 5:
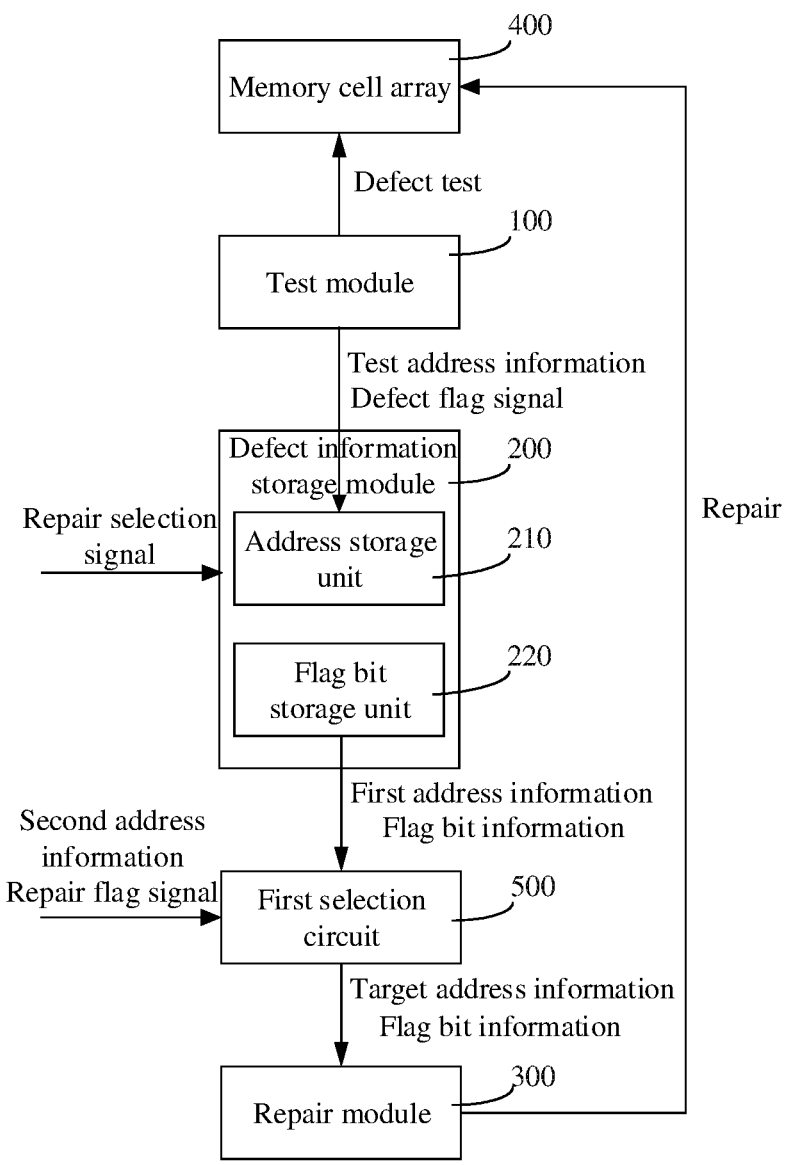
FIG. 5 is a structure diagram of a defect repair circuit according to a fifth embodiment.

FIG. 5 is a structure diagram of a defect repair circuit according to a fifth embodiment. Referring to FIG. 5, the defect repair circuit in the embodiment includes the test module 100, the defect information storage module 200, the first selection circuit 500, and the repair module 300. The address storage unit 210 is connected with the test module 100 and the first selection circuit 500 respectively. A flag bit storage module is also connected with the test module 100 and the first selection circuit 500 respectively. Both the address storage unit 210 and the flag bit storage unit 220 store information responsive to the defect flag signal. Furthermore, the first selection circuit 500 synchronously receive the first address information and flag bit information corresponding to the defective memory cell. In such a setting manner, the address storage unit 210 and the flag bit storage unit 220 may synchronously store and output information of the same defective memory cell, so that the storage accuracy and reliability are improved.

Figure 6:
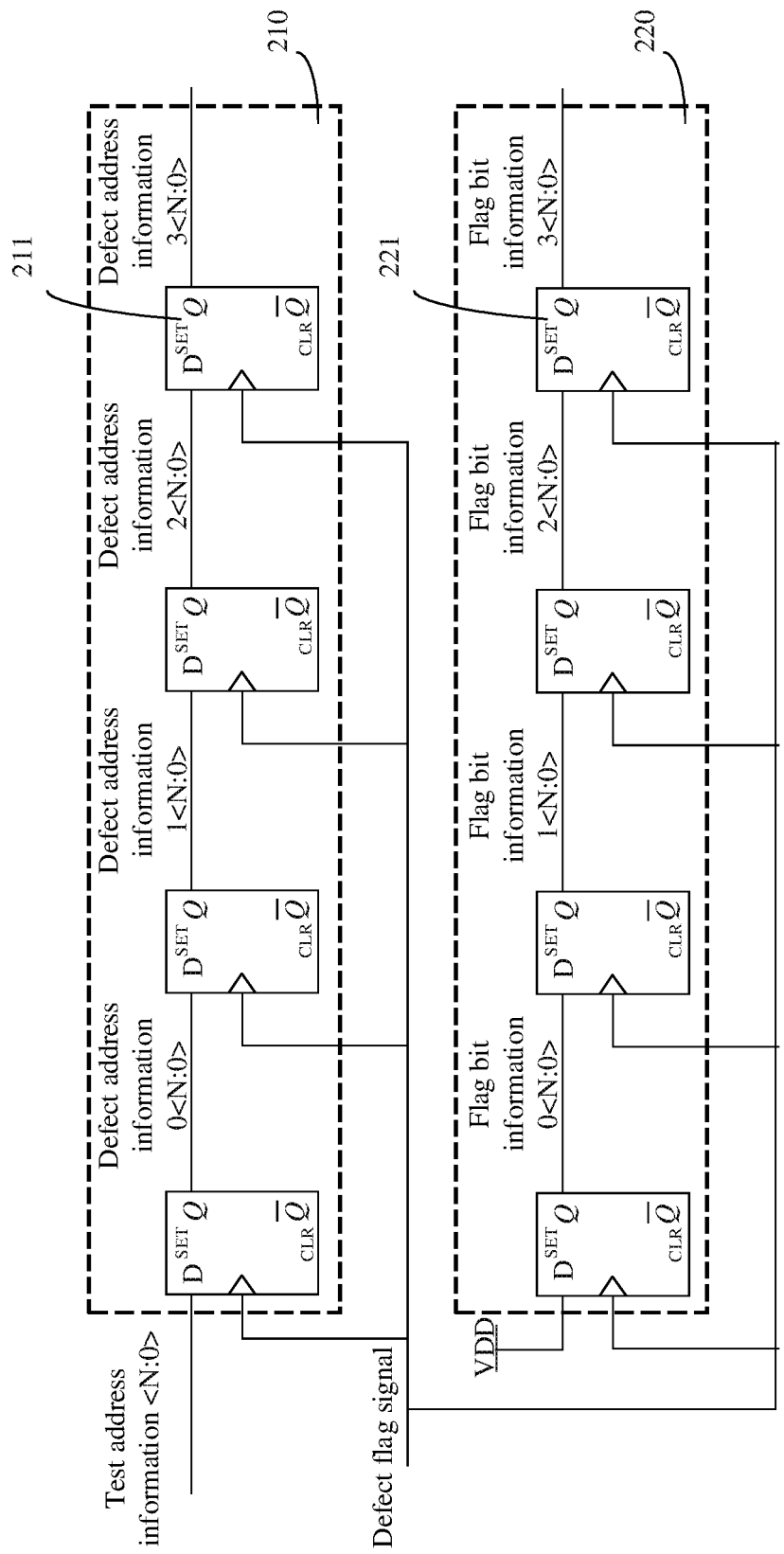
FIG. 6 is a structure diagram of an address storage unit and a flag bit storage unit according to an embodiment.

Furthermore, FIG. 6 is a structure diagram of an address storage unit 210 and a flag bit storage unit 220 according to an embodiment. Referring to FIG. 6, in the embodiment, the address storage unit 210 includes N stages of address buffer memories 211, and the flag bit storage unit 220 includes N stages of flag buffer memories 221. N is an integer greater than or equal to 2.

Specifically, the N stages of address buffer memories 211 are sequentially numbered as a first-stage address buffer memory 211 to an Nth-stage address buffer memory 211. A clock end of the address buffer memory 211 is configured to receive the defect flag signal. A data input end of the first-stage address buffer memory 211 is configured to receive the test address information. An output end of an (N−1)th-stage address buffer memory 211 is connected with a data input end of the Nth-stage address buffer memory 211. The N stages of flag buffer memories 221 are sequentially numbered as a first-stage flag buffer memory 221 to an Nth-stage flag buffer memory 221. A clock end of the flag buffer memory 221 receives the defect flag signal. A data input end of the first-stage flag buffer memory 221 is configured to connect a preset level signal. An output end of an (N−1)th-stage flag buffer memory 221 is connected with a data input end of the Nth-stage address buffer memory 211. An address latch and a flag bit latch that are arranged in pairs are configured to latch the first address information or the flag bit information of the same defective memory cell.

Furthermore, both the address buffer memory 211 and the flag buffer memory 221 may be D triggers, and have the same hardware structure. Furthermore, path lengths between the clock ends of each pair of address buffer memory 211 and flag buffer memory 221 and a defect flag signal input interface are the same. Therefore, the pulse signal may synchronously arrive at the first-stage address buffer memory 211 and the first-stage flag buffer memory 221.

Exemplarily, descriptions are made taking generating a pulse signal in the defect flag signal when the defective memory cell is tested as an example. Referring to FIG. 6, when a previous pulse signal arrives, the first-stage address buffer memory 211 samples test address information input by the input end to generate defect address information 0<N:0>, and the first-stage flag buffer memory 221 samples a preset level signal input by the input end to generate flag bit information 0<N:0>. Before a next pulse signal arrives, the information of output ends of the first-stage address buffer memory 211 and the first-stage flag buffer memory 221 is kept unchanged. When the next pulse signal arrives, a second-stage address buffer memory 211 may sample a signal received by an input end thereof to generate defect address information 1<N:0>, and the first-stage address buffer memory 211 may also update the information of the output end thereof according to the new test address information to generate new defect address information 0<N:0>. The previous pulse signal and the next pulse signal are two pulses that are adjacent in time sequence. By parity of reasoning, every time when a pulse signal arrives, a result of a previous-stage buffer memory may be sent to a next stage for buffering, thereby realizing the storage function of the defect information storage module 200 for multiple pieces of defect address information and multiple pieces of flag bit information.

Figure 7:
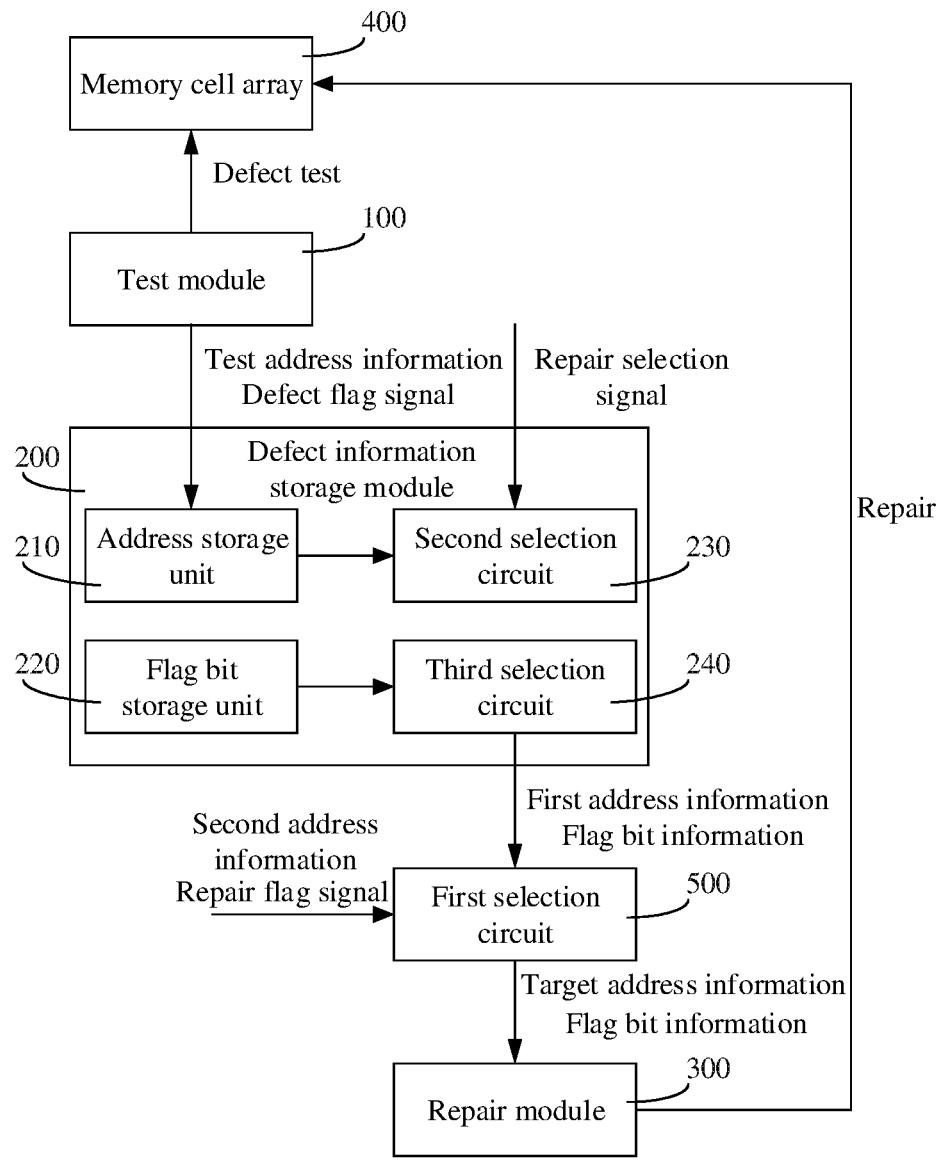
FIG. 7 is a structure diagram of a defect repair circuit according to a sixth embodiment.

FIG. 7 is a structure diagram of a defect repair circuit according to a sixth embodiment. Referring to FIG. 7, in the embodiment, the defect information storage module 200 further includes a second selection circuit 230 and a third selection circuit 240.

For the second selection circuit 230, a control end of the second selection circuit 230 is configured to receive the repair selection signal, N input ends of the second selection circuits 230 are correspondingly connected with output ends of the N stages of address buffer memories 211 one to one, and an output end of the second selection circuit 230 is configured to output the first address information. The second selection circuit 230 is connected with the defect information storage module 200 and the first selection circuit 500 respectively to determine the first address information from the multiple pieces of defect address information according to the repair selection signal.

Figure 8:
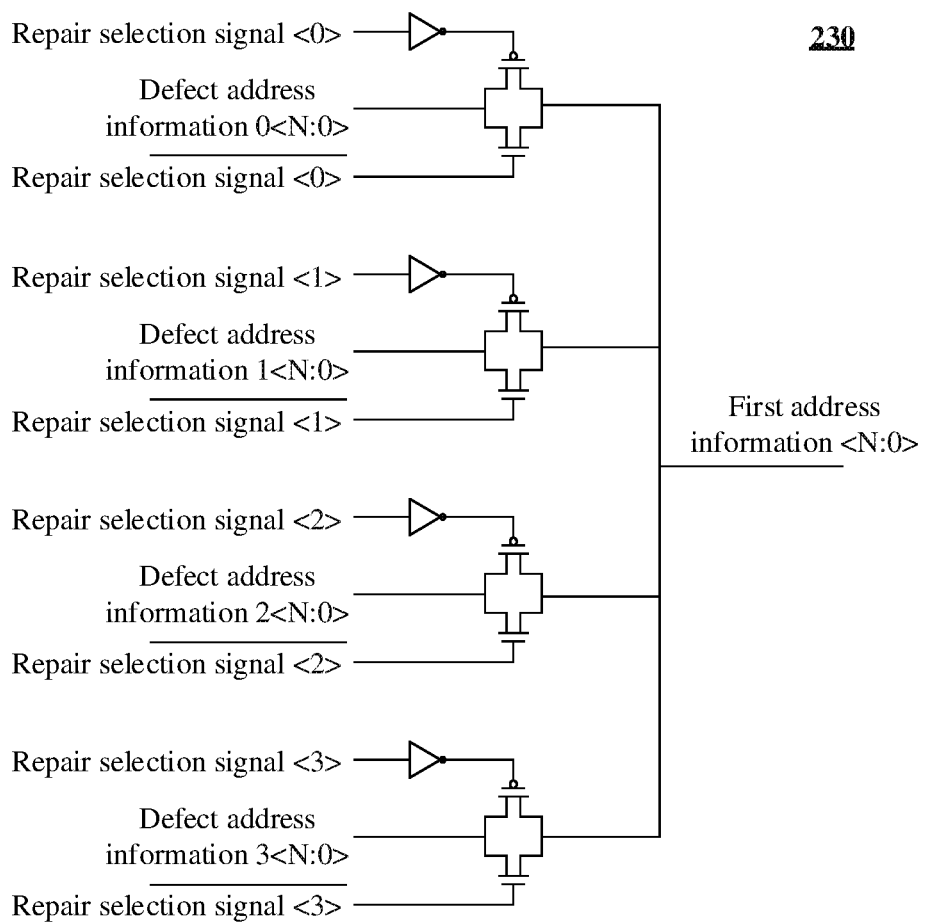
FIG. 8 is a structure diagram of a second selection circuit according to an embodiment.

Specifically, FIG. 8 is a structure diagram of a second selection circuit 230 according to an embodiment. Referring to FIG. 8, the second selection circuit 230 may be a multiplexer. The multiplexer is configured with multiple input ends, and the number of the input ends is the same as the number of the address buffer memories 211. The multiple input ends of the multiplexer are correspondingly connected with the multiple address buffer memories 211 one to one to acquire the multiple pieces of defect address information. In the embodiment, multiple control ends are further configured. The control ends correspond to the input ends one to one. At most one of the multiple control ends is enabled at the same time, thereby ensuring that one of the multiple pieces of defect address information is selected and output as the first address information. Each control end may be configured to input two signals, i.e., the repair selection signal and an inverted signal of the repair selection signal respectively. That is, when any one of the two signals may switch on a corresponding transistor, a path of the signal may be switched on, so that the running speed of the second selection circuit 230 is increased.

For the third selection circuit 240, a control end of the third selection circuit 240 is configured to receive the repair selection signal, N input ends of the third selection circuits 240 are correspondingly connected with output ends of the N stages of flag buffer memories 221 one to one, and an output end of the third selection circuit 240 is configured to output the flag bit information. The third selection circuit 240 is connected with the defect information storage module 200 and the first selection circuit 500 respectively to determine first flag information from multiple pieces of flag bit information according to the repair selection signal.

Figure 9:
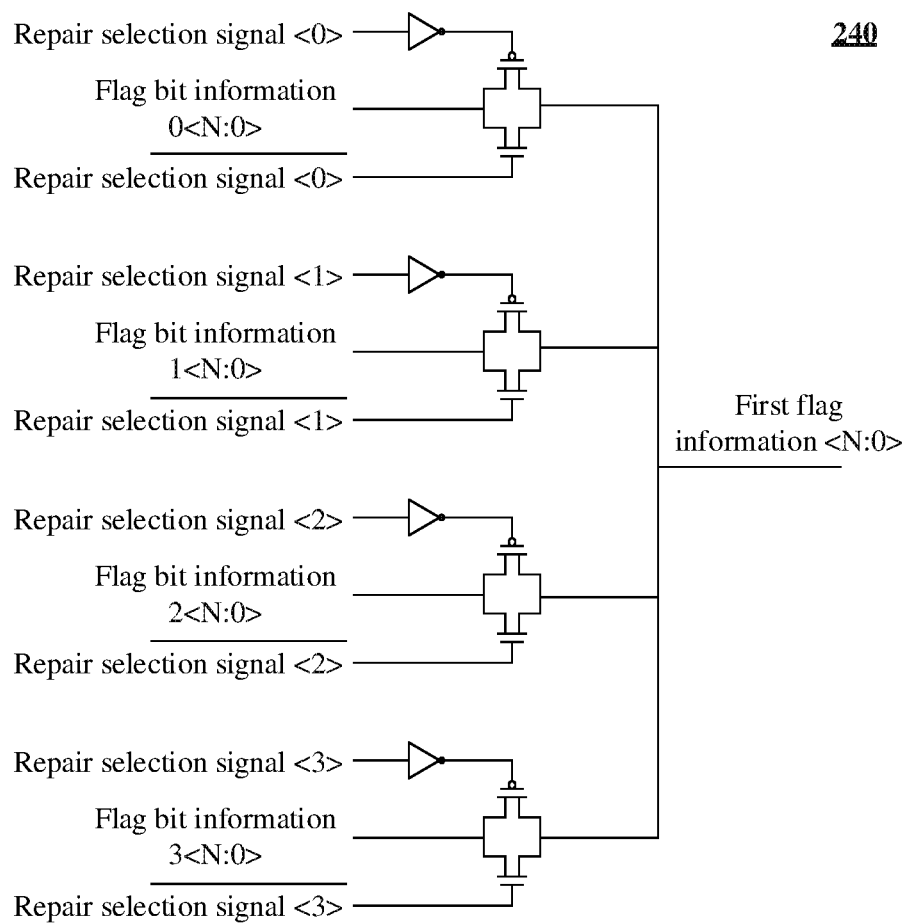
FIG. 9 is a structure diagram of a third selection circuit according to an embodiment.

Specifically, FIG. 9 is a structure diagram of a third selection circuit 240 according to an embodiment. Referring to FIG. 9, the third selection circuit 240 may be a multiplexer. The multiplexer is configured with multiple input ends, and the number of the input ends is the same as the number of the flag buffer memories 221. The multiple input ends of the multiplexer are correspondingly connected with the multiple flag buffer memories 221 one to one to acquire the multiple pieces of flag bit information. In the embodiment, multiple control ends are further configured. The control ends correspond to the input ends one to one. At most one of the multiple control ends is enabled at the same time, thereby ensuring that one of the multiple pieces of flag bit information is selected and output as the first flag information. Each control end may be configured to input two signals, i.e., the repair selection signal and an inverted signal of the repair selection signal respectively. That is, when any one of the two signals may switch on a corresponding transistor, a path of the signal may be switched on, so that the running speed of the third selection circuit 240 is increased.

Figure 10:
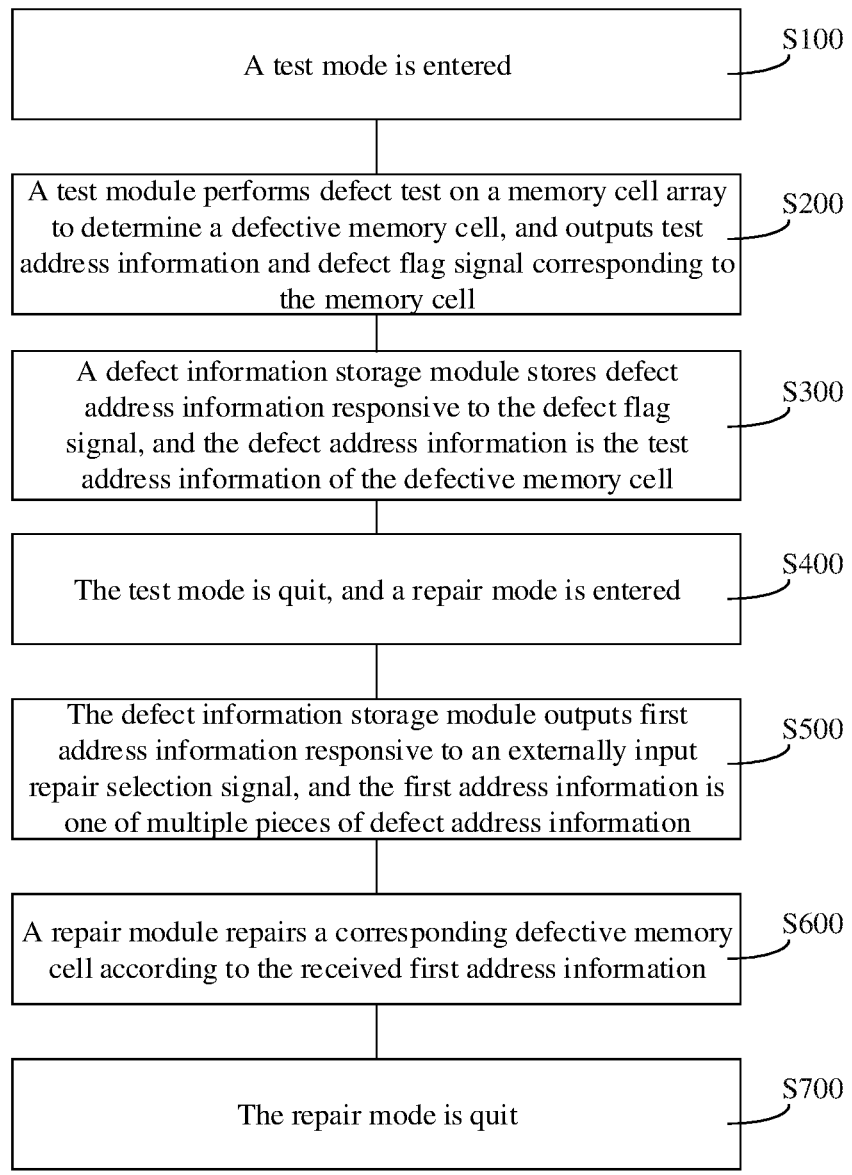
FIG. 10 is a flowchart of a defect repair method according to an embodiment.

FIG. 10 is a flowchart of a defect repair method according to an embodiment. Referring to FIG. 10, the defect repair method in the embodiment includes S100 to S700.

At S100, a test mode is entered.

At S200, a test module 100 performs defect test on a memory cell array 400 to determine a defective memory cell, and outputs test address information and defect flag signal corresponding to the memory cell.

At S300, a defect information storage module 200 stores defect address information responsive to the defect flag signal, and the defect address information is the test address information of the defective memory cell.

At S400, the test mode is quit, and a repair mode is entered.

At S500, the defect information storage module 200 outputs first address information responsive to an externally input repair selection signal, and the first address information is one of multiple pieces of defect address information.

At S600, a repair module 300 repairs a corresponding defective memory cell according to the received first address information.

At S700, the repair mode is quit.

In the embodiment, a relatively high and convenient defect repair method is implemented through S100 to S700. It can be understood that specific implementation modes may refer to the corresponding implementation modes of the defect repair circuit, and will not be repeated herein one by one.

Figure 11:
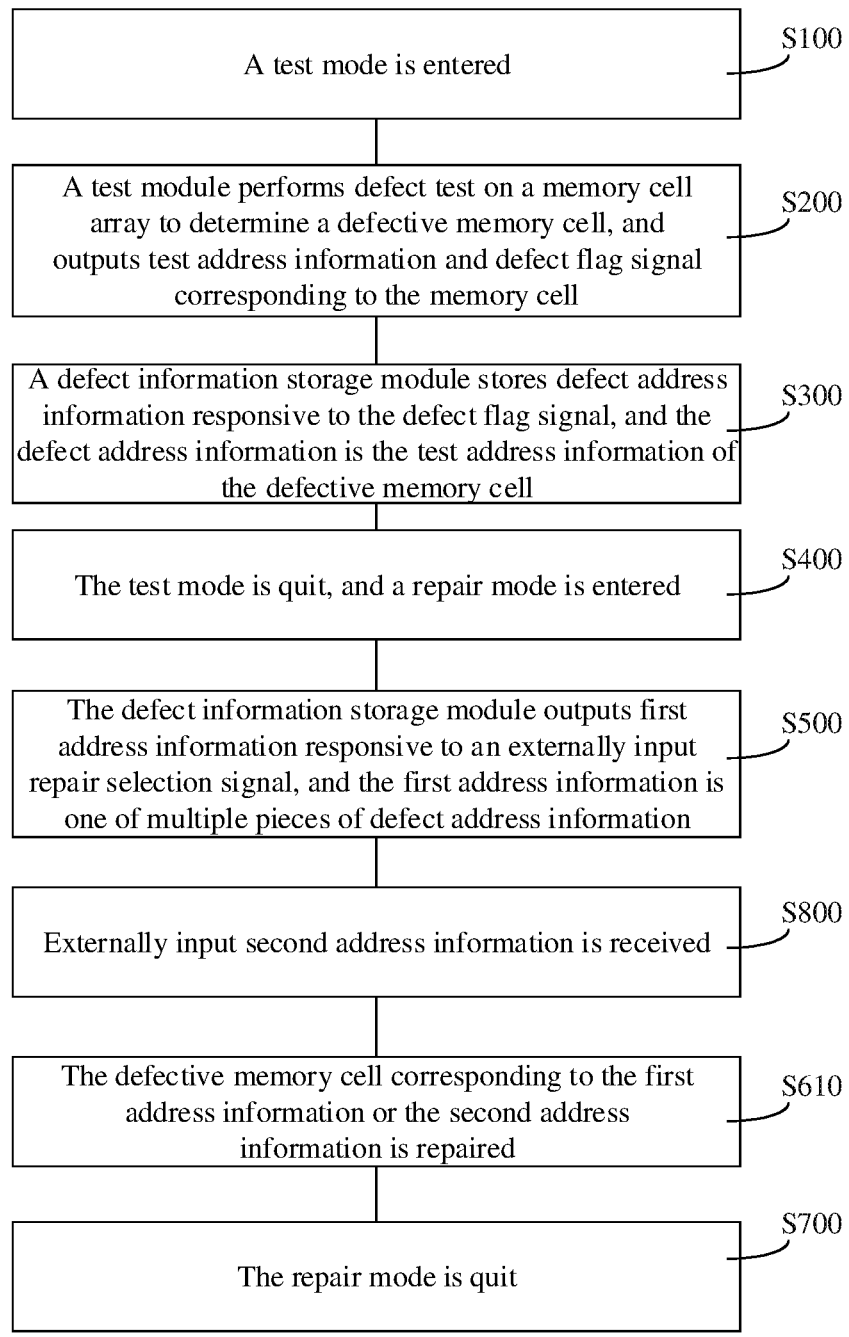
FIG. 11 is a flowchart of a defect repair method according to another embodiment.

FIG. 11 is a flowchart of a defect repair method according to another embodiment. Referring to FIG. 11, in the embodiment, before S600, the method further includes as follows.

At S800, externally input second address information is received.

Moreover, operation S600 includes as follows.

At S610, the defective memory cell corresponding to the first address information or the second address information is repaired.

Figure 12:
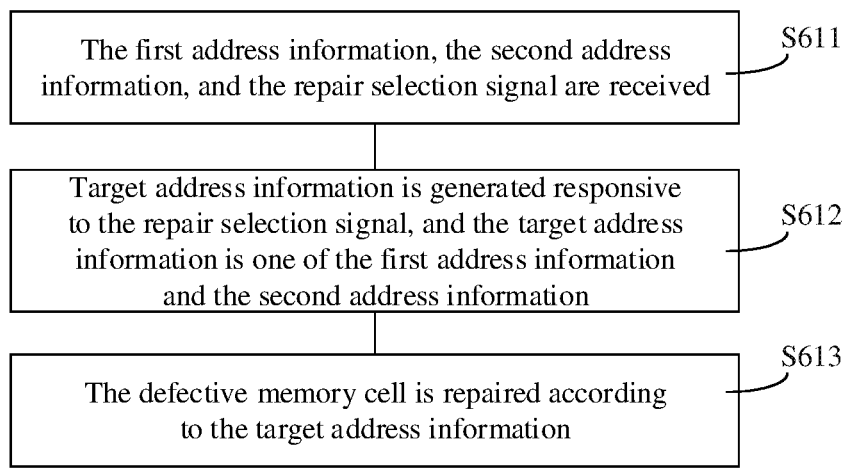
FIG. 12 is a flowchart of operation S610 according to an embodiment.

FIG. 12 is a flowchart of operation S610 according to an embodiment. Referring to FIG. 12, operation S610 includes operations S611 to S613.

At S611, the first address information, the second address information, and the repair selection signal are received.

At S612, target address information is generated responsive to the repair selection signal, and the target address information is one of the first address information and the second address information.

At S613, the defective memory cell is repaired according to the target address information.

In an embodiment, before S500, the method further includes: corresponding flag bit information is generated for the defective memory cell responsive to the defect flag signal.

Figure 13:
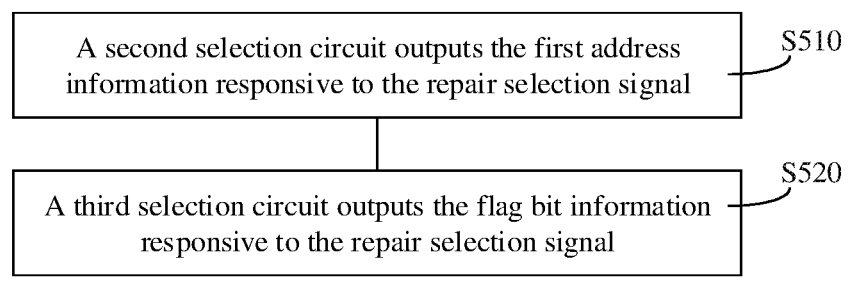
FIG. 13 is a flowchart of operation S500 according to an embodiment.

FIG. 13 is a flowchart of operation S500 according to an embodiment. Referring to FIG. 13, operation S500 includes operations S510 to S520.

At S510, a second selection circuit 230 outputs the first address information responsive to the repair selection signal.

At S520, a third selection circuit 240 outputs the flag bit information responsive to the repair selection signal.

The first address information and the flag bit information are synchronously output.

It is to be understood that, although each step in each flowchart is sequentially presented according to the indications of the arrowheads, these steps are not always executed according to sequences indicated by the arrowheads. Unless otherwise clearly described in the disclosure, there are no strict limits made to execution sequences of these steps and these steps may be executed in other sequences. Moreover, at least part of steps in each flowchart may include multiple sub-steps or multiple stages, these sub-steps or stages are not always executed and completed at the same time but may be executed at different times, and these sub-steps or stages are not always sequentially executed but may be executed in turn or alternately with at least part of other steps or sub-steps or stages of the other steps.

Each technical feature of the abovementioned embodiments may be combined freely. For simplicity of description, not all possible combinations of each technical solution in the abovementioned embodiments are described. However, any combination of these technical features shall fall within the scope recorded in the specification without conflicting.

The abovementioned embodiments only express some implementation modes in the embodiments of the disclosure and are specifically described in detail and not thus understood as limits to the patent scope of the disclosure. It is to be pointed out that those of ordinary skill in the art may further make a plurality of transformations and improvements without departing from the concept of the embodiments of the disclosure, and all these fall within the scope of protection of the embodiments of the disclosure. Therefore, the scope of patent protection of the embodiments of the disclosure should be subject to the appended claims.

The invention claimed is:

1. A defect repair circuit, comprising:
a processor; and
a memory configured to store instructions executable by the processor;
wherein the processor is configured to:
perform defect test on a memory cell array in a test mode to determine a defective memory cell, and output test address information and defect flag signal corresponding to the defective memory cell;
store defect address information responsive to the defect flag signal, the defect address information being the test address information of the defective memory cell, generate and store flag bit information for the defective memory cell responsive to the defect flag signal, and output first address information responsive to an externally input repair selection signal, the first address information being one of multiple pieces of defect address information; and
repair the defective memory cell according to the first address information,
wherein the defect repair circuit further comprises:
N stages of address buffer memories, wherein the N stages of address buffer memories are sequentially numbered as a first-stage address buffer memory to an Nth-stage address buffer memory, a clock end of each of the N stages of address buffer memories is configured to receive the defect flag signal, a data input end of the first-stage address buffer memory is configured to receive the test address information, and an output end of an (N−1)th-stage address buffer memory is connected with a data input end of the Nth-stage address buffer memory, N being an integer greater than or equal to 2; and
N stages of flag buffer memories, wherein the N stages of flag buffer memories are sequentially numbered as a first-stage flag buffer memory to an Nth-stage flag buffer memory, a clock end of each of the N stages of flag buffer memories receives the defect flag signal, a data input end of the first-stage flag buffer memory is configured to connect a preset level signal, and an output end of an (N−1)th-stage flag buffer memory is connected with a data input end of the Nth-stage address buffer memory.

2. The defect repair circuit of claim 1, wherein the processor is further configured to receive externally input second address information, and repair the defective memory cell corresponding to the first address information or the second address information.

3. The defect repair circuit of claim 2, further comprising:
a first selection circuit configured to receive the first address information, the second address information and the repair selection signal, and generate target address information responsive to the repair selection signal, the target address information being one of the first address information and the second address information.

4. The defect repair circuit of claim 3, wherein the first selection circuit synchronously receives the first address information and the flag bit information for the defective memory cell.

5. The defect repair circuit of claim 1, further comprising:
a second selection circuit, wherein a control end of the second selection circuit is configured to receive the repair selection signal, N input ends of the second selection circuits are correspondingly connected with output ends of the N stages of address buffer memories one to one, and an output end of the second selection circuit is configured to output the first address information; and
a third selection circuit, wherein a control end of the third selection circuit is configured to receive the repair selection signal, N input ends of the third selection circuits are correspondingly connected with output ends of the N stages of flag buffer memories one to one, and an output end of the third selection circuit is configured to output the flag bit information.

6. The defect repair circuit of claim 5, wherein the second selection circuit is a multiplexer; the multiplexer is configured with multiple input ends, and a number of the input ends is identical with a number of the N stages of address buffer memories; and the multiple input ends of the multiplexer are correspondingly connected with the N stages of address buffer memories one to one to acquire the multiple pieces of defect address information.

7. The defect repair circuit of claim 6, wherein multiple control ends are further configured, each control end of the multiple control ends corresponds to each input end of the multiple input ends one to one, and at most one of the multiple control ends is enabled at the same time.

8. The defect repair circuit of claim 7, wherein each control end of the multiple control ends is configured to input two signals, which include the repair selection signal and an inverted signal of the repair selection signal respectively.

9. A defect repair method, comprising:
entering a test mode;
performing, by a defect repair circuit, defect test on a memory cell array to determine a defective memory cell, and outputting test address information and defect flag signal corresponding to the defective memory cell;
storing, by the defect repair circuit, defect address information responsive to the defect flag signal, the defect address information being the test address information of the defective memory cell;
generating and storing flag bit information for the defective memory cell responsive to the defect flag signal;
quitting the test mode, and entering a repair mode;
outputting, by the defect repair circuit, first address information responsive to an externally input repair selection signal, the first address information being one of multiple pieces of defect address information;
repairing, by the defect repair circuit, the defective memory cell according to the first address information; and
quitting the repair mode,
wherein the defect repair circuit comprises:
N stages of address buffer memories, wherein the N stages of address buffer memories are sequentially numbered as a first-stage address buffer memory to an Nth-stage address buffer memory, a clock end of each of the N stages of address buffer memories is configured to receive the defect flag signal, a data input end of the first-stage address buffer memory is configured to receive the test address information, and an output end of an (N−1)th-stage address buffer memory is connected with a data input end of the Nth-stage address buffer memory, N being an integer greater than or equal to 2; and
N stages of flag buffer memories, wherein the N stages of flag buffer memories are sequentially numbered as a first-stage flag buffer memory to an Nth-stage flag buffer memory, a clock end of each of the N stages of flag buffer memories receives the defect flag signal, a data input end of the first-stage flag buffer memory is configured to connect a preset level signal, and an output end of an (N−1)th-stage flag buffer memory is connected with a data input end of the Nth-stage address buffer memory.

10. The defect repair method of claim 9, before repairing the defective memory cell according to the first address information, further comprising:
   receiving externally input second address information;
   wherein the repairing the defective memory cell according to the first address information comprises:
      repairing the defective memory cell corresponding to the first address information or the second address information.

11. The defect repair method of claim 10, wherein the repairing the defective memory cell corresponding to the first address information or the second address information comprises:
   receiving the first address information, the second address information and the repair selection signal;
   generating target address information responsive to the repair selection signal, the target address information being one of the first address information and the second address information; and
   repairing the defective memory cell according to the target address information.

12. The defect repair method of claim 9, wherein the outputting the first address information responsive to the externally input repair selection signal, the first address information being one of the multiple pieces of defect address information, comprises:
   outputting, by the defect repair circuit, the first address information responsive to the repair selection signal; and
   outputting, by the defect repair circuit, the flag bit information responsive to the repair selection signal;
   wherein the first address information and the flag bit information are synchronously output.

* * * * *